US011690191B1

(12) United States Patent
Ciou et al.

(10) Patent No.: US 11,690,191 B1
(45) Date of Patent: Jun. 27, 2023

(54) ELECTRONIC DEVICE

(71) Applicants: MICRO-STAR INT'L CO., LTD., New Taipei (TW); MSI COMPUTER (SHENZHEN) CO., LTD., Shenzhen (CN)

(72) Inventors: Ting Rong Ciou, New Taipei (TW); Yung Ching Huang, New Taipei (TW); Shang-Chih Yang, New Taipei (TW)

(73) Assignees: MICRO-STAR INT'L CO., LTD., New Taipei (TW); MSI COMPUTER (SHENZHEN) CO., LTD., Shenzhen (CN)

( * ) Notice: Subject to any disclaimer, the term of this patent is extended or adjusted under 35 U.S.C. 154(b) by 0 days.

(21) Appl. No.: 17/721,249

(22) Filed: Apr. 14, 2022

(30) Foreign Application Priority Data

Jan. 12, 2022 (TW) .................................. 111101214
Jan. 12, 2022 (TW) .................................. 111200402

(51) Int. Cl.
*H05K 7/14* (2006.01)
*G06F 1/18* (2006.01)

(52) U.S. Cl.
CPC ........... *H05K 7/1402* (2013.01); *G06F 1/184* (2013.01); *G06F 1/185* (2013.01); *G06F 1/186* (2013.01)

(58) Field of Classification Search
CPC ....... H05K 7/1402; G06F 1/184; G06F 1/185; G06F 1/186
See application file for complete search history.

(56) References Cited

U.S. PATENT DOCUMENTS

| | | | | | |
|---|---|---|---|---|---|
| 3,829,741 | A | * | 8/1974 | Athey | H05K 3/366 361/801 |
| 3,932,016 | A | * | 1/1976 | Ammenheuser | H05K 7/1418 361/801 |
| 4,046,443 | A | * | 9/1977 | Champagne | H05K 7/1418 439/377 |
| 4,716,495 | A | * | 12/1987 | Craker | H05K 7/1414 361/801 |
| 5,402,319 | A | * | 3/1995 | Shumaker | H05K 7/1404 439/282 |
| 5,694,291 | A | * | 12/1997 | Feightner | G06F 1/184 361/801 |
| 5,708,563 | A | * | 1/1998 | Cranston, III | G06F 1/186 361/801 |
| 5,734,551 | A | * | 3/1998 | Hileman | G06F 1/185 361/801 |
| 6,017,004 | A | * | 1/2000 | Grantham | G06F 1/184 361/752 |
| 6,049,449 | A | * | 4/2000 | Cranston, III | G06F 1/186 361/801 |

(Continued)

*Primary Examiner* — Adrian S Wilson
(74) *Attorney, Agent, or Firm* — Maschoff Brennan (57) ABSTRACT

An electronic device including a chassis, a motherboard, an expansion card and a support. The motherboard is disposed in the chassis. The expansion card includes a circuit board assembly and a fixing plate. The circuit board assembly is fixed to a side of the fixing plate. The circuit board assembly is electrically connected to the motherboard and is fixed to the chassis via the fixing plate. A side of the support supports a side of the circuit board assembly that is located farthest from the fixing plate. A side of the support that is located farthest from the circuit board assembly is fixed to the motherboard and the chassis.

10 Claims, 6 Drawing Sheets

(56) References Cited

U.S. PATENT DOCUMENTS

| | | | | |
|---|---|---|---|---|
| 6,320,752 B1 * | 11/2001 | Jang | ..................... | H05K 7/1408 361/740 |
| 6,349,039 B1 * | 2/2002 | Boe | ........................ | G06F 1/184 361/801 |
| 6,396,685 B1 * | 5/2002 | Chien | ..................... | G06F 1/184 361/679.41 |
| 6,406,322 B1 * | 6/2002 | Barringer | ................ | G06F 1/185 361/752 |
| 6,929,781 B1 * | 8/2005 | Hohmann | ............ | B01J 19/0093 436/179 |
| 6,970,363 B2 * | 11/2005 | Bassett | ................... | G06F 1/186 361/755 |
| 7,583,515 B2 * | 9/2009 | Chih-Min | ............... | G06F 1/183 361/807 |
| 7,894,210 B1 * | 2/2011 | Searby | ................. | H05K 7/1424 361/752 |
| 9,247,669 B2 * | 1/2016 | Hsieh | ..................... | G06F 1/186 |

\* cited by examiner

FIG. 6

ELECTRONIC DEVICE

CROSS-REFERENCE TO RELATED APPLICATIONS

This non-provisional application claims priority under 35 U.S.C. § 119(a) on Patent Application No(s). 111101214 filed in Taiwan, R.O.C. on Jan. 12, 2022, and on Patent Application No(s). 111200402 filed in Taiwan, R.O.C. on Jan. 12, 2022, the entire contents of which are hereby incorporated by reference.

TECHNICAL FIELD

The disclosure relates to an electronic device, more particularly to an electronic device including at least one expansion card.

BACKGROUND

In general, a graphics card includes a fixing plate and a circuit board assembly. The circuit board assembly is fixed to one side of the fixing plate. The circuit board assembly is plugged into an electrical connector disposed on a motherboard and is fixed to a chassis via the fixing plate. Since the demand for enhancing the performance of the graphics card increases, the quantity of electronic components of the circuit board assembly increases, causing the overall weight of the circuit board assembly to increase. Therefore, one side of the circuit board assembly that is located farthest from the fixing plate sags due to lack of support. Accordingly, some manufactures install a support on the chassis to support the side of the circuit board assembly that is located farthest from the fixing plate.

However, for example, when the specification of the motherboard is changed, the position where the power supply is disposed on the motherboard may be changed, which also changes the position where the electrical connector for the graphics card is disposed on the motherboard. In this way, the distance between the circuit board assembly of the graphics card and the chassis is changed, and thus the support may be too short or too long to stably support the circuit board assembly of the expansion card. That is, the conventional support configured to be fixed to the chassis is unable to be used in common among motherboards of different specifications.

SUMMARY

The disclosure provides an electronic device whose support is able to stably support expansion cards disposed in different positions on the motherboard, thereby enabling the support to be used in common among motherboards of different specifications.

One embodiment of this disclosure provides an electronic device including a chassis, a motherboard, an expansion card and a support. The motherboard is disposed in the chassis. The expansion card includes a circuit board assembly and a fixing plate. The circuit board assembly is fixed to a side of the fixing plate. The circuit board assembly is electrically connected to the motherboard and is fixed to the chassis via the fixing plate. A side of the support supports a side of the circuit board assembly that is located farthest from the fixing plate. A side of the support that is located farthest from the circuit board assembly is fixed to the motherboard and the chassis.

According to the electronic device disclosed by the above embodiments, since the side of the support that is located farthest from the circuit board assembly is fixed to the motherboard and the chassis, the support can be fixed to the chassis via the existing through holes of the motherboard. Also, for the motherboard, the distances between the electrical connector for the expansion card and the through holes are nearly not changed with the specification of the motherboard. Accordingly, the support according to this disclosure not only can stably support the circuit board assembly of the expansion card, but also can be used in common among motherboards of different specifications.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
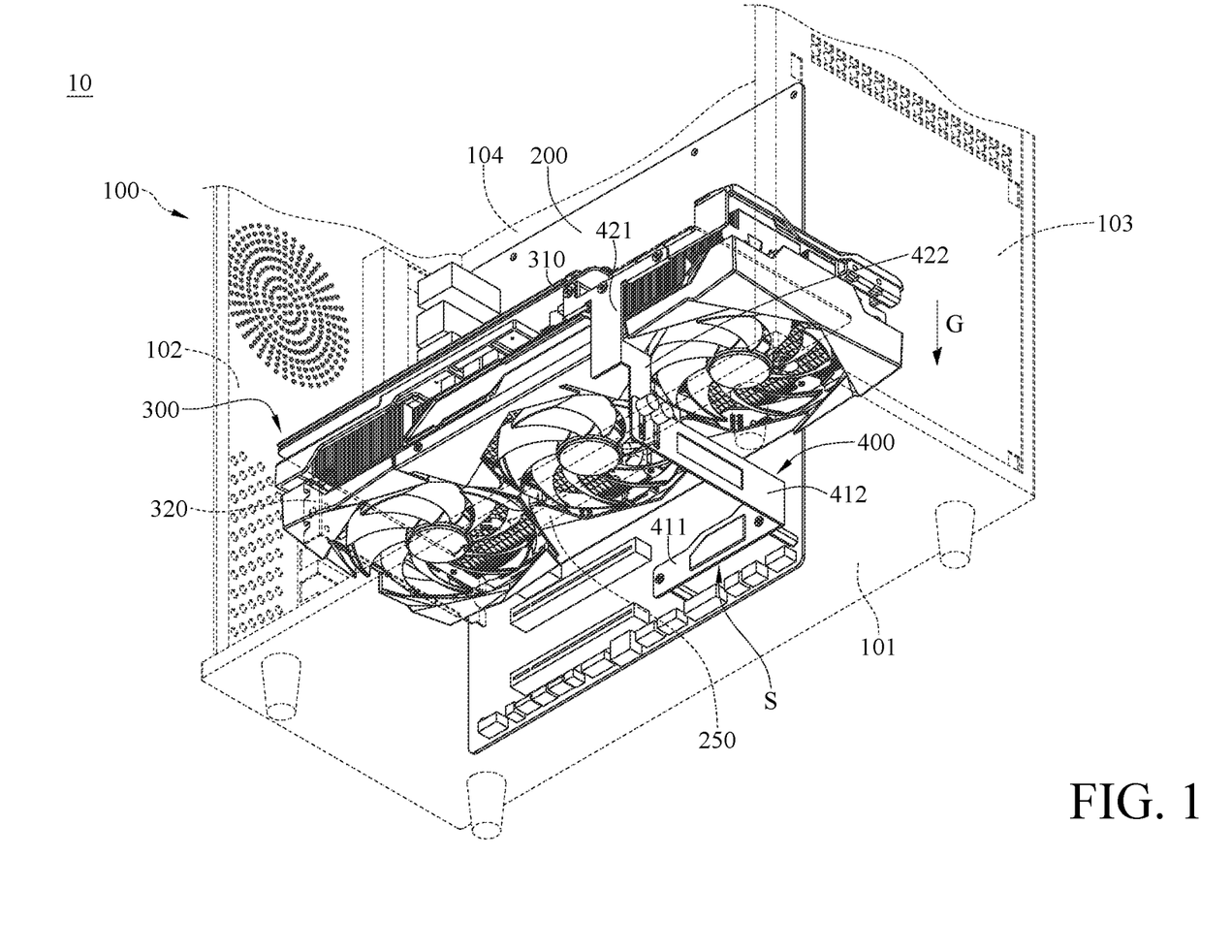
FIG. 1 is a partially enlarged perspective view of an electronic device according to a first embodiment of the disclosure.
Figure 2:
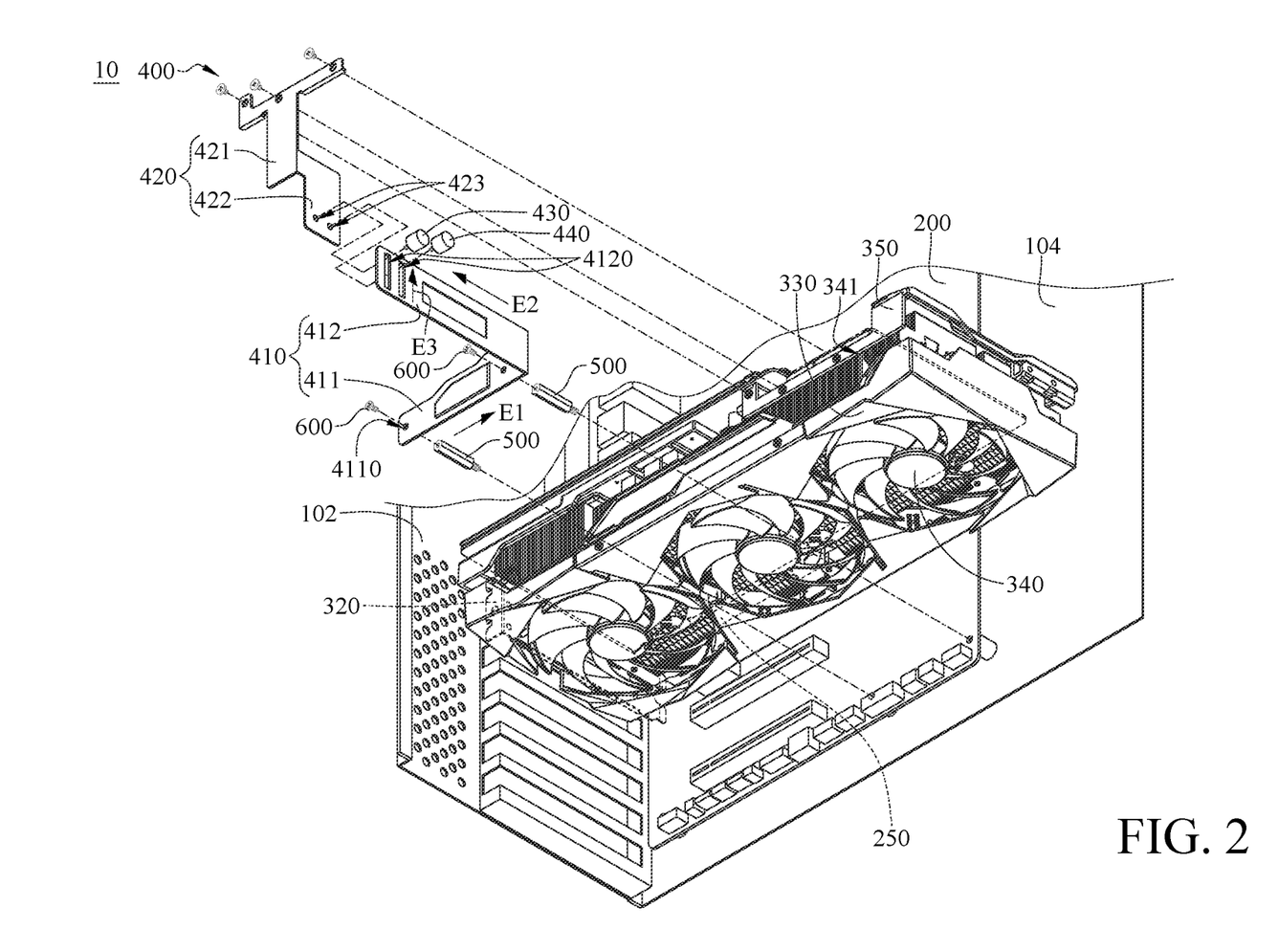
FIG. 2 is a partially enlarged and exploded view of the electronic device in FIG. 1.
Figure 3:
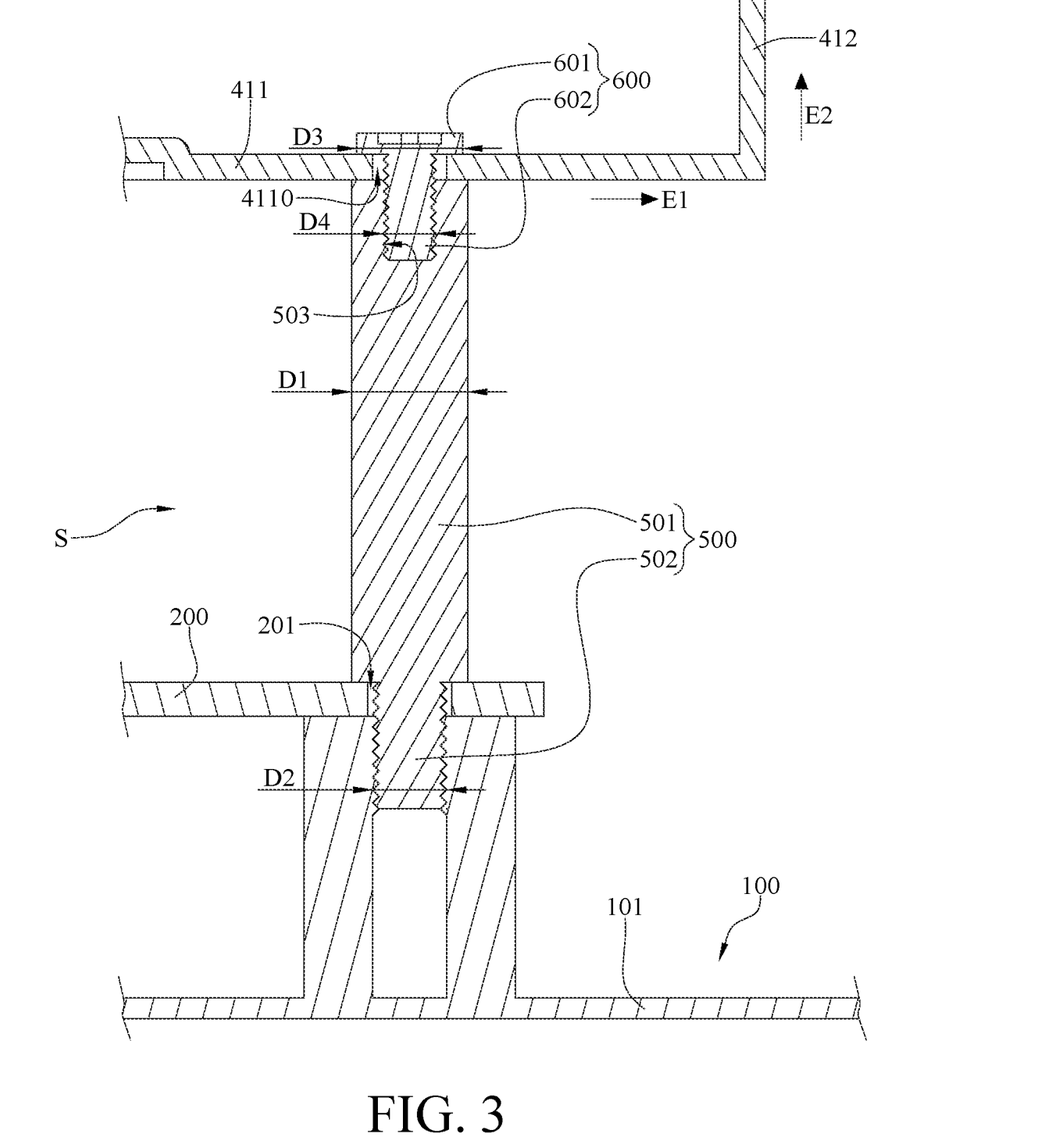
FIG. 3 is a partially enlarged cross-sectional view of the electronic device in FIG. 1.

Please refer to FIGS. 1 to 3, where FIG. 1 is a partially enlarged perspective view of an electronic device 10 according to a first embodiment of the disclosure, FIG. 2 is a partially enlarged and exploded view of the electronic device 10 in FIG. 1, and FIG. 3 is a partially enlarged cross-sectional view of the electronic device 10 in FIG. 1.

In this embodiment, the electronic device 10 is, for example, a computer host and includes a chassis 100, a motherboard 200, an expansion card 300 and a support 400. The motherboard 200 is disposed in the chassis 100. The expansion card 300 is, for example, a graphics card and includes a circuit board assembly 310 and a fixing plate 320. The circuit board assembly 310 is fixed to one side of the fixing plate 320. The circuit board assembly 310 is electrically connected to the motherboard 200 and fixed to the chassis 100 via the fixing plate 320. One side of the support 400 supports one side of the circuit board assembly 310 that is located farthest from the fixing plate 320, and one side of the support 400 that is located farthest from the circuit board assembly 310 is fixed to the motherboard 200 and the chassis 100. In this embodiment, the electronic device 10 further includes an electrical connector 250 that is fixed on and electrically connected to the motherboard 200. The circuit board assembly 310 is plugged in the electrical connector 250 and is electrically connected to the motherboard 200 via the electrical connector 250.

In this embodiment, the chassis 100 includes a bottom plate 101, a top plate, a first side plate 102, a second side plate 103, a third side plate 104 and a fourth side plate. Note that in order to clearly show the technical features of this disclosure, the top plate and the fourth side plate are omitted in the drawings. The first side plate 102, the second side plate 103, the third side plate 104 and the fourth side plate connect the bottom plate 101 and the top plate, and the bottom plate 101 is opposite to the top plate. The first side plate 102 is opposite to the second side plate 103. The third side plate 104 and the fourth side plate are opposite to each other and are located between the first side plate 102 and the second side plate 103. The top plate is located above the bottom plate 101 along a gravitational direction G. In this embodiment, the fixing plate 320 of the expansion card 300 is fixed to the first side plate 102, and the motherboard 200 is disposed on the third side plate 104.

In this embodiment, the support 400 includes a first support 410 and a second support 420. The first support 410 includes a first fixing part 411 and a first extending part 412.

In this embodiment, the electronic device 10 further includes two studs 500 and two screws 600, and the motherboard 200 has two through holes 201. The first fixing part 411 is fixed to the motherboard 200 and the chassis 100 via the two studs 500 and the two screws 600. Since the two studs 500 and the two screws 600 respectively cooperate with the two through holes 201 in a similar manner, only the cooperation between one stud 500, one screw 600 and one through hole 201 is described in detail hereinafter. Specifically, the stud 500 includes a first head part 501 and a first body part 502 that are connected to each other. A diameter D1 of the first head part 501 is larger than a diameter D2 of the first body part 502. The first head part 501 has a screw hole 503. The screw hole 503 is located at one end of the first head part 501 that is located farthest from the first body part 502. The screw 600 includes a second head part 601 and a second body part 602 that are connected to each other. A diameter D3 of the second head part 601 is larger than a diameter D4 of the second body part 602. The second body part 602 is disposed through a through hole 4110 of the first fixing part 411 and is screwed into the screw hole 503 of the first head part 501. The first fixing part 411 is clamped between the second head part 601 and the first head part 501. The first head part 501 is clamped between the first fixing part 411 and the motherboard 200, such that a gap S is formed between the first fixing part 411 and the motherboard 200. For example, the gap S is configured to accommodate at least one electronic component disposed on the motherboard 200 to enhance the space utilization of the motherboard 200. The first body part 502 is disposed through the through holes 201 of the motherboard 200 and is screwed into the bottom plate 101 of the chassis 100.

The first extending part 412 stands on one side of the first fixing part 411 that is located farthest from the motherboard 200. An extension direction E1 of the first fixing part 411 is non-parallel to an extension direction E2 of the first extending part 412. In this embodiment, the extension direction E1 of the first fixing part 411 is, for example, perpendicular to the extension direction E2 of the first extending part 412.

The second support 420 includes a second fixing part 421 and a second extending part 422. The second extending part 422 is movably disposed on one side of the first extending part 412 that is located farthest from the first fixing part 411. The second extending part 422 extends toward the circuit board assembly 310 of the expansion card 300. In this embodiment, the support 400 further includes a thumb screw 430 and a guide 440. The first extending part 412 has two guiding slots 4120 that are spaced apart from each other. An extension direction E3 of the two guiding slots 4120 is, for example, perpendicular to the extension direction E2 of the first extending part 412. The second extending part 422 has two fixing holes 423 that are spaced apart from each other. The thumb screw 430 is removably disposed in one of the two fixing holes 423 and is slidably disposed in one of the two guiding slots 4120. The guide 440 is removably disposed in the other fixing hole 423 and is slidably disposed in the other guiding slot 4120. In this embodiment, the guide 440 is, for example, a thumb screw, but the disclosure is not limited thereto. In other embodiments, the guide may be a guiding pillar or a guiding pin.

The second fixing part 421 is connected to one side of the second extending part 422 that is located farthest from the first extending part 412, and one side of the second fixing part 421 that is located farthest from the second extending part 422 supports the circuit board assembly 310 of the expansion card 300. In this embodiment, the side of the second fixing part 421 that is located farthest from the second extending part 422 is fixed to the side of the circuit board assembly 310 of the expansion card 300 that is located farthest from the motherboard 200 via screwing. Further, in this embodiment, the expansion card 300 further includes a fan frame 330, a plurality of fans 340 and a strengthening plate 350. The fans 340 are fixed to the circuit board assembly 310 via the fan frame 330. The strengthening plate 350 is fixed to the circuit board assembly 310 and prevents the circuit board assembly 310 from being deformed when the fans 340 or a fin assembly 341 of the expansion card 300 are/is screwed in the circuit board assembly 310. Additionally, in some other embodiments, a thermal pad may be disposed on the bottom of the strengthening plate (i.e., one side of the strengthening plate that is located closest to the motherboard), to expand the lifespan of the circuit board assembly and enhance the reliability of the circuit board assembly. In this embodiment, the side of the second fixing part 421 that is located farthest from the second extending part 422 is fixed to one side of the strengthening plate 350 that is located farthest from the motherboard 200 via screwing.

In other embodiments, the electronic device may merely include one stud and one screw. Alternatively, in still other embodiments, the electronic device may not include the stud 500, and the side of the support that is located farthest from the circuit board assembly may be fixed to the motherboard and the chassis via at least one screw. Also, in such embodiments, the first fixing part of the first support may be in contact with the motherboard.

In other embodiments, the support may not include the thumb screw 430 and the guide 440. In such embodiments, the first extending part may not have the two guiding slots 4120, the second extending part may not have the two fixing holes 423, and the second extending part may be movably disposed on the first extending part via one or more gears and a rack.

In other embodiments, the second extending part may be fixed to the first extending part. Alternatively, in still other embodiments, the second extending part and the first extending part may be integrally formed as a single piece.

Figure 4:
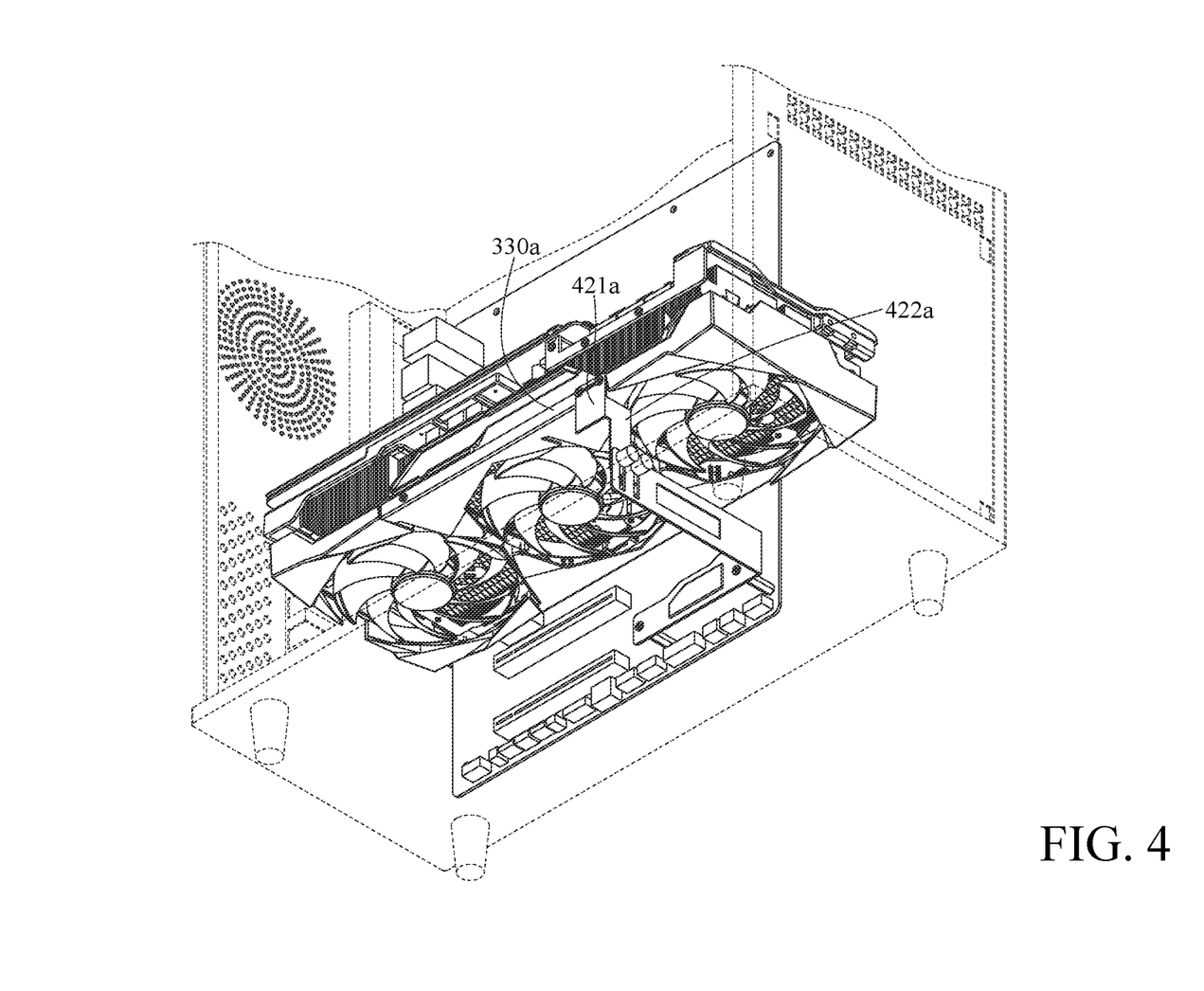
FIG. 4 is a partially enlarged perspective view of an electronic device according to a second embodiment of the disclosure.

The disclosure is not limited to how the second fixing part supports the expansion card. Please refer to FIG. 4 that is a partially enlarged perspective view of an electronic device according to a second embodiment of the disclosure. The main difference between this embodiment and the first embodiment is the position where the second fixing part is fixed to the expansion card. Other similar features (e.g., the chassis, the motherboard, the expansion card and other features related to the support) can be understood by referring to the descriptions related to FIGS. 1 to 3 and thus are omitted. In this embodiment, one side of a second fixing part 421a that is located farthest from a second extending part 422a is fixed to a fan frame 330a via screwing.

Figure 5:
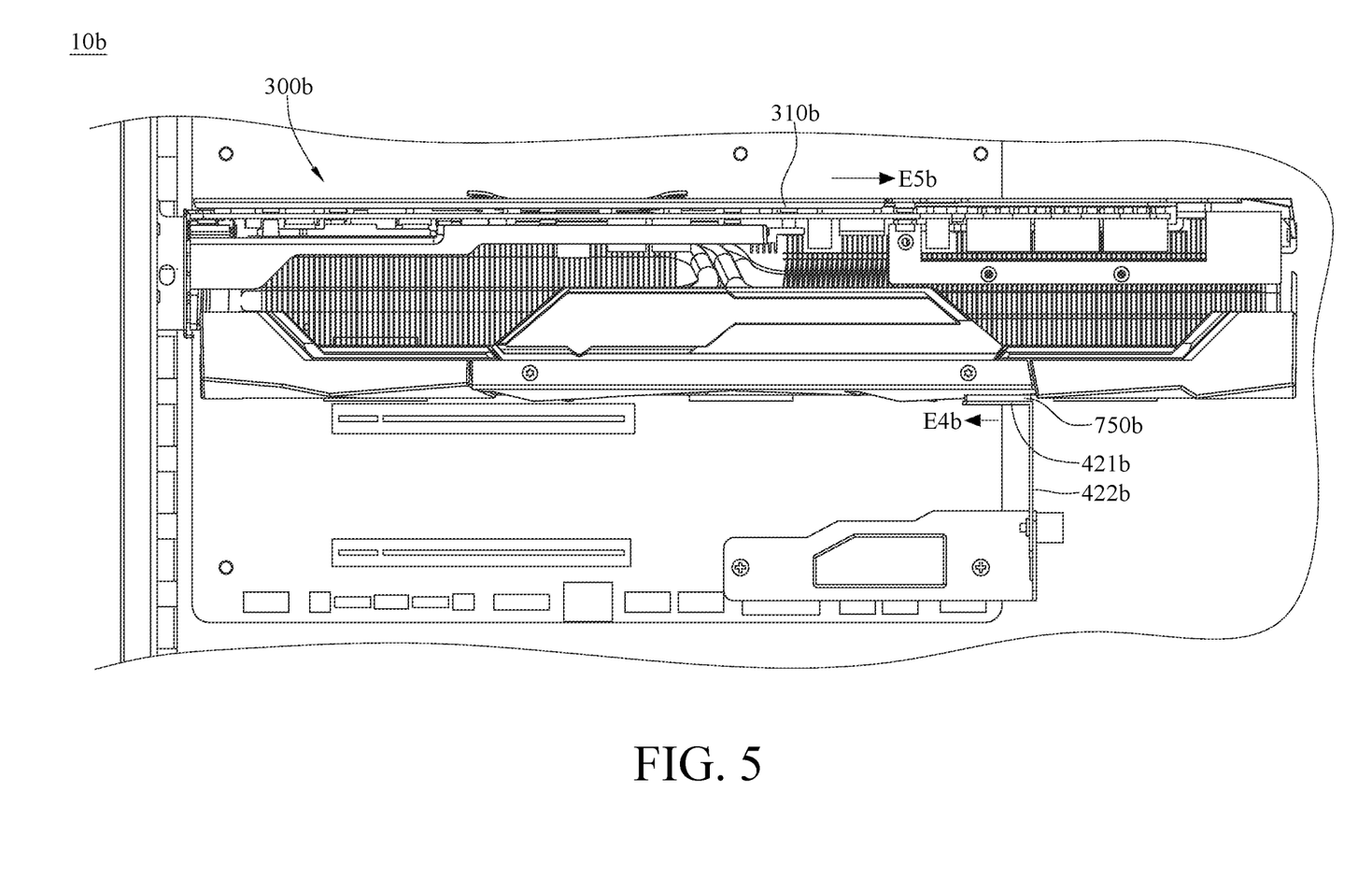
FIG. 5 is a partially enlarged side view of an electronic device according to a third embodiment of the disclosure.

Please refer to FIG. 5 that is a partially enlarged side view of an electronic device 10b according to a third embodiment of the disclosure. The main difference between this embodiment and the first embodiment is the position where the second fixing part is fixed to the expansion card. Other similar features (e.g., the chassis, the motherboard, the expansion card and other features related to the support) can be understood by referring to the descriptions related to FIGS. 1 to 3 and thus are omitted. In this embodiment, an extension direction E4b of a second fixing part 421b is parallel to an extension direction E5b of an expansion card 300b of a circuit board assembly 310b, and one side of the circuit board assembly 310b of the expansion card 300b that is located closest to a second extending part 422b rests on one side of the second fixing part 421b that is located farthest from the second extending part 422b. In this embodiment, the electronic device 10b further includes a pad 750b. The pad 750b is clamped between the circuit board assembly 310b and the second fixing part 421b and is made of, for example, rubber.

Figure 6:
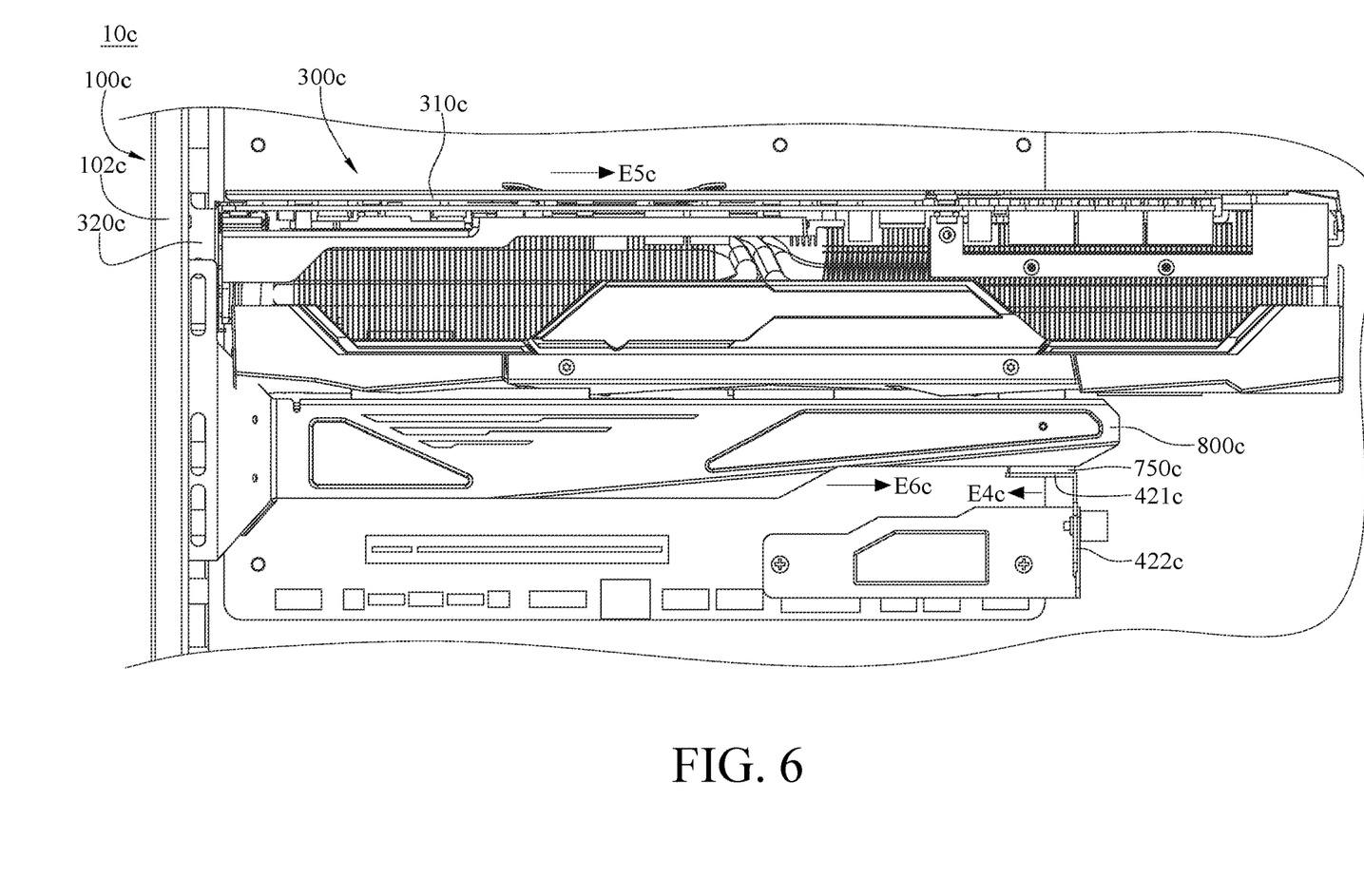
FIG. 6 is a partially enlarged side view of an electronic device according to a fourth embodiment of the disclosure.

Please refer to FIG. 6 that is a partially enlarged side view of an electronic device 10c according to a fourth embodiment of the disclosure. The main difference between this embodiment and the third embodiment is that the electronic device 10c according to this embodiment further includes a tray 800c. Other similar features (e.g., the chassis, the motherboard, the expansion card and the support) can be understood by referring to the descriptions related to FIGS. 1 to 3 and 5 and thus are omitted. In this embodiment, the tray 800c and a fixing plate 320c are fixed to the same side of a chassis 100c; that is, the tray 800c and the fixing plate 320c both are fixed to a first side plate 102c of the chassis 100c. An extension direction E6c of the tray 800c is parallel to an extension direction E4c of a second fixing part 421c and an extension direction E5c of a circuit board assembly 310c of an expansion card 300c. Also, one side of the circuit board assembly 310c of the expansion card 300c that is located closest to a second extending part 422c rests on the second fixing part 421c via the tray 800c. In this embodiment, the electronic device 10c further includes a pad 750c. The pad 750c is clamped between the tray 800c and the second fixing part 421c and is made of, for example, rubber.

According to the electronic device disclosed by the above embodiments, since the side of the support that is located farthest from the circuit board assembly is fixed to the motherboard and the chassis, the support can be fixed to the chassis via the existing through holes of the motherboard. Also, for the motherboard, the distances between the electrical connector for the expansion card and the through holes are nearly not changed with the specification of the motherboard. Accordingly, the support according to this disclosure not only can stably support the circuit board assembly of the expansion card, but also can be used in common among motherboards of different specifications.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. An electronic device, comprising:
a chassis;
a motherboard, disposed in the chassis;
an expansion card, wherein the expansion card comprises a circuit board assembly and a fixing plate, the circuit board assembly is fixed to a side of the fixing plate, and the circuit board assembly is electrically connected to the motherboard and is fixed to the chassis via the fixing plate; and
a support, wherein a side of the support supports a side of the circuit board assembly that is located farthest from the fixing plate, and a side of the support that is located farthest from the circuit board assembly is fixed to the motherboard and the chassis.

2. The electronic device according to claim 1, further comprising a stud and a screw, wherein the motherboard has a through hole, the stud comprises a first head part and a first body part that are connected to each other, a diameter of the first head part is larger than a diameter of the first body part, the first head part has a screw hole, the screw hole is located at an end of the first head part that is located farthest from the first body part, the screw comprises a second head part and a second body part that are connected to each other, a diameter of the second head part is larger than a diameter of the second body part, the second body part is disposed through the support and is screwed into the screw hole of the first head part, a part of the support is clamped between the second head part and the first head part, the first head part is clamped between the support and the motherboard so that a gap is formed between the support and the motherboard, and the first body part is disposed through the through hole of the motherboard and is screwed into the chassis.

3. The electronic device according to claim 1, wherein the support comprises a first support and a second support, the first support comprises a first fixing part and a first extending part, the first fixing part is fixed to the motherboard and the chassis, the first extending part stands on a side of the first fixing part that is located farthest from the motherboard, an extension direction of the first fixing part is non-parallel to an extension direction of the first extending part, the second support comprises a second fixing part and a second extending part, the second extending part is movably disposed on a side of the first extending part that is located farthest from the first fixing part and extends toward the circuit board assembly of the expansion card, the second fixing part is connected to a side of the second extending part that is located farthest from the first extending part, and a side of the second fixing part that is located farthest from the second extending part supports the circuit board assembly of the expansion card.

4. The electronic device according to claim 3, wherein the support further comprises a thumb screw and a guide, the first extending part has two guiding slots that are spaced apart from each other, the second extending part has two fixing holes that are spaced apart from each other, the thumb screw is removably disposed in one of the two fixing holes and is slidably disposed in one of the two guiding slots, and the guide is removably disposed in another one of the two fixing holes and is slidably disposed in another one of the two guiding slots.

5. The electronic device according to claim 3, wherein the side of the second fixing part that is located farthest from the second extending part is fixed to the circuit board assembly of the expansion card via screwing.

6. The electronic device according to claim 5, wherein the side of the second fixing part that is located farthest from the second extending part is fixed to a side of the circuit board assembly of the expansion card that is located farthest from the motherboard via screwing.

7. The electronic device according to claim 3, wherein the circuit board assembly of the expansion card rests on the side of the second fixing part that is located farthest from the second extending part.

8. The electronic device according to claim 7, wherein an extension direction of the second fixing part is parallel to an extension direction of the circuit board assembly of the expansion card, and a side of the circuit board assembly of the expansion card that is located closest to the second extending part rests on the second fixing part.

9. The electronic device according to claim 8, further comprising a tray, wherein the tray and the fixing plate are fixed to a side of the chassis, an extension direction of the tray is parallel to the extension direction of the second fixing part and the extension direction of the circuit board assembly of the expansion card, and the side of the circuit board assembly of the expansion card that is located closest to the second extending part rests on the second fixing part via the tray.

10. The electronic device according to claim 1, further comprising a screw, wherein the side of the support that is located farthest from the circuit board assembly is fixed to the motherboard and the chassis via the screw.

* * * * *